(12) United States Patent
Senzaki et al.

(10) Patent No.: US 7,470,470 B2
(45) Date of Patent: Dec. 30, 2008

(54) SYSTEM AND METHOD FOR FORMING MULTI-COMPONENT DIELECTRIC FILMS

(75) Inventors: Yoshihide Senzaki, Aptos, CA (US); Seung Gyun Park, Scotts Valley, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 212 days.

(21) Appl. No.: 10/829,781

(22) Filed: Apr. 21, 2004

(65) Prior Publication Data

US 2005/0064207 A1 Mar. 24, 2005

Related U.S. Application Data

(60) Provisional application No. 60/560,952, filed on Apr. 9, 2004, provisional application No. 60/520,964, filed on Nov. 17, 2003, provisional application No. 60/464,458, filed on Apr. 21, 2003.

(51) Int. Cl.
*B32B 9/00* (2006.01)
(52) U.S. Cl. .................................... 428/446
(58) Field of Classification Search ................ 428/446, 428/336, 701, 698; 501/313
See application file for complete search history.

(56) References Cited

U.S. PATENT DOCUMENTS

| | | | |
|---|---|---|---|
| 3,911,176 A | 10/1975 | Curtis et al. | |
| 4,668,531 A | 5/1987 | Asano et al. | |
| 4,772,346 A | 9/1988 | Anderson et al. | |
| 5,051,278 A | 9/1991 | Paz-Pujalt | |
| 5,130,172 A | 7/1992 | Hicks et al. | |
| 5,185,317 A | 2/1993 | Wessels et al. | |
| 5,271,957 A | 12/1993 | Wernberg et al. | |
| 5,686,151 A | 11/1997 | Imai et al. | |
| 5,688,565 A | 11/1997 | McMillan et al. | |
| 5,789,027 A | 8/1998 | Watkins et al. | |
| 5,843,516 A | 12/1998 | Derbenwick et al. | |
| 5,876,503 A | 3/1999 | Roeder et al. | |

(Continued)

FOREIGN PATENT DOCUMENTS

EP 1146140 A1 10/2001

(Continued)

OTHER PUBLICATIONS

Senzaki, Y., et al., "MOCVD of High-$k$ Dielectrics, Tantalum Nitride and Copper from Directly Injected Liquid Precursors", *Adv. Mater. Opt. Electron.*, 2000, 10:93-103.

(Continued)

*Primary Examiner*—Keith D. Hendricks
*Assistant Examiner*—Daniel Miller
(74) *Attorney, Agent, or Firm*—Morgan, Lewis & Bockius LLP

(57) ABSTRACT

The present invention provides systems and methods for mixing precursors such that a mixture of precursors are present together in a chamber during a single pulse step in an atomic layer deposition (ALD) process to form a multi-component film. The precursors are comprised of at least one different chemical component, and such different components will form a mono-layer to produce a multi-component film. In a further aspect of the present invention, a dielectric film having a composition gradient is provided.

4 Claims, 11 Drawing Sheets

U.S. PATENT DOCUMENTS

| | | | |
|---|---|---|---|
| 5,879,209 | A | 3/1999 | Gadgil et al. |
| 5,972,430 | A | 10/1999 | DiMeo, Jr. et al. |
| 6,030,900 | A | 2/2000 | Grassl et al. |
| 6,099,903 | A | 8/2000 | Kaloyeros et al. |
| 6,203,613 | B1 | 3/2001 | Gates et al. |
| 6,214,729 | B1 | 4/2001 | Uhlenbrock et al. |
| 6,238,734 | B1 | 5/2001 | Senzaki et al. |
| 6,277,436 | B1 | 8/2001 | Stauf et al. |
| 6,399,208 | B1 | 6/2002 | Baum et al. |
| 6,465,371 | B2 | 10/2002 | Lim |
| 6,509,280 | B2 | 1/2003 | Choi |
| 6,537,613 | B1 | 3/2003 | Senzaki et al. |
| 6,552,209 | B1 | 4/2003 | Lei et al. |
| 6,642,131 | B2 * | 11/2003 | Harada ........................ 438/591 |
| 2001/0034123 | A1 | 10/2001 | Jeon et al. |
| 2002/0058843 | A1 | 5/2002 | Min et al. |
| 2002/0119327 | A1 | 8/2002 | Arkles et al. |
| 2002/0164420 | A1 | 11/2002 | Derderian et al. |
| 2002/0175393 | A1 | 11/2002 | Baum et al. |
| 2002/0187644 | A1 | 12/2002 | Baum et al. |
| 2003/0012876 | A1 | 1/2003 | Min et al. |
| 2003/0040196 | A1 | 2/2003 | Lim et al. |
| 2003/0190423 | A1 | 10/2003 | Yang et al. |
| 2003/0232511 | A1 | 12/2003 | Metzner et al. |
| 2003/0235961 | A1 * | 12/2003 | Metzner et al. ............. 438/287 |

FOREIGN PATENT DOCUMENTS

| | | |
|---|---|---|
| KR | 2002-0032054 | 5/2002 |
| WO | WO 01/25502 A1 | 4/2001 |
| WO | WO 2004/017377 A2 | 2/2004 |
| WO | WO 2004/017378 A2 | 2/2004 |
| WO | WO 2004/017383 A2 | 2/2004 |

OTHER PUBLICATIONS

Gordon, R. et al., "Vapor Deposition of Metal Oxides and Silicates: Possible Gate Insulators for Future Microelectronics," Chem. Mater., 2001, pp. 2463-2464.

Hausmann, D et al., "Surface Morphology and Crystallinity Control in the Atomic Layer Deposition (ALD) of Hafnium and Zirconium Oxide Thin Films," Journal of Crystal Growth, 249, 2003, pp. 251-261.

Kukli, K. et al., "Atomic Layer Deposition of Hafnium Dioxide Films from Hafnium Tetrakis (ethylmethylamide) and Water," Chem. Vap. Deposition, 2002, vol. 8, No. 5, pp. 199-204.

* cited by examiner

| Film | Hf | Si | O | O/(Hf+Si) ratio | C | H | N |
|---|---|---|---|---|---|---|---|
| $Hf_{0.34}Si_{0.66}O_2$ | 11.0% | 21.8% | 65.0% | 1.98 | 0.8% | 1.2% | 0.2% |
| $Hf_{0.40}Si_{0.60}O_2$ | 13.0% | 19.2% | 66.0% | 2.05 | 0.9% | 0.8% | 0.1% |
| $Hf_{0.48}Si_{0.52}O_2$ | 15.6% | 16.7% | 66.2% | 2.05 | 0.9% | 0.2% | 0.4% |
| $Hf_{0.58}Si_{0.42}O_2$ | 18.5% | 13.5% | 66.3% | 2.07 | 1.0% | 0.6% | 0.1% |
| $Hf_{0.82}Si_{0.18}O_2$ | 27.0% | 5.8% | 66.4% | 2.02 | 0.2% | 0.6% | 0.0% |

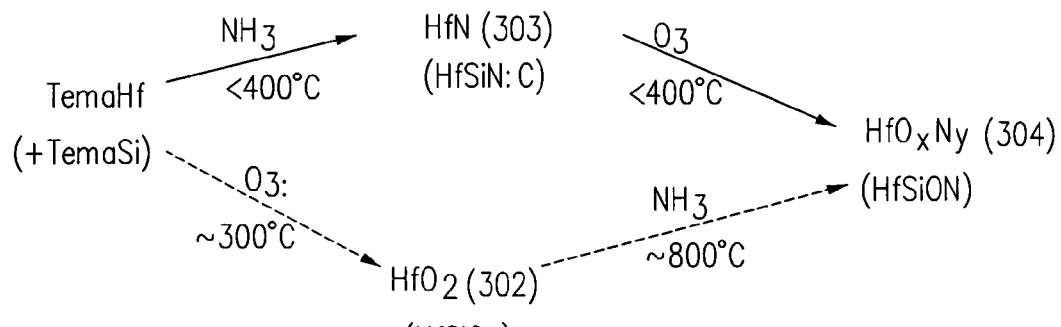
FIG. 16b
FIG. 16a
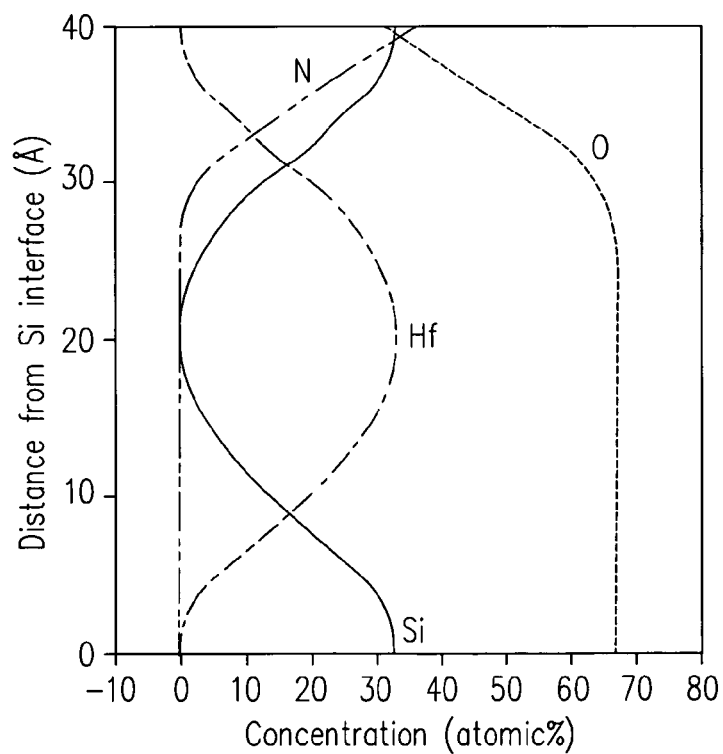
FIG. 17

SYSTEM AND METHOD FOR FORMING MULTI-COMPONENT DIELECTRIC FILMS

CROSS REFERENCE TO RELATED APPLICATIONS

This application claims the benefit of, and priority to, each of U.S. provisional patent application Ser. No. 60/464,458 filed on Apr. 21, 2003 entitled Fabrication Method of Multi-Component Films; U.S. provisional patent application Ser. No. 60/520,964 filed Nov. 17, 2003 entitled ALD of HfSiON with Controlled Thickness and Composition Gradient; and U.S. provisional patent application Ser. No. 60/560,952 filed Apr. 9, 2004 entitled Atomic Layer Deposition of Metal or Mixed Metal Thin Films, the entire disclosures of each of which are incorporated by reference herein.

FIELD OF THE INVENTION

In general, the present invention relates to systems and methods for forming dielectric films in semiconductor applications. More specifically, the present invention relates to systems and methods for fabricating multi-component dielectric films on a substrate using mixed vaporized precursors.

BACKGROUND OF THE INVENTION

Concurrent with the increase in sophistication and drive towards miniaturization of microelectronics, the number of transistors per integrated circuit has exponentially grown and promises to grow to meet the demands for faster, smaller and more powerful electronic systems. However, as traditional silicon-based transistor geometries reach a critical point where the silicon dioxide gate dielectric becomes just a few atomic layers thick, tunneling of electrons will become more prevalent leading to current leakage and increase in power dissipation. Accordingly, an alternative dielectric possessing a higher permittivity or dielectric constant than silicon dioxide and capable of preventing current tunneling or leakage would be highly desirable. Among the most promising dielectric candidates to replace silicon dioxide includes hafnium oxide, zirconium oxide and tantalum oxide.

Unfortunately, these materials are chemically and thermally unstable on silicon, unlike silicon dioxide, forming defects and charge traps at the interface between the metal dielectric and the silicon substrate. The charge traps and defects absorb the voltage applied at the gate and perturb the performance and reliability of the transistor. To limit the formation of interfacial charge traps and defects, an interfacial layer of silicon dioxide is deposited in between the dielectric and the silicon substrate. The silicon dioxide interface buffers the silicon substrate from the dielectric, but the silicon dioxide interface may not be compatible with the surface properties of the dielectric. Accordingly, an interface that can ameliorate the surface properties and chemistries of the dielectric and silicon substrate, while minimizing the equivalent physical oxide thickness, is needed to fabricate ultra-thin high k dielectrics.

Prior art deposition techniques for fabricating films such as chemical vapor deposition (CVD) are increasingly unable to meet the requirements of advanced thin films. While CVD processes can be tailored to provide conformal films with improved step coverage, CVD processes often require high processing temperatures. For instance, one of the obstacles of making high k gate dielectrics is the formation of an interfacial silicon oxide layer during CVD processes. Gas phase reaction in CVD leads to particle generation. Another obstacle is the limitation of prior art CVD processes in depositing ultra thin films for high k gate dielectrics on a silicon substrate.

An alternative to traditional CVD processes to deposit very thin films is Atomic layer deposition (ALD). ALD has several advantages over traditional CVD. ALD can be performed at comparatively low temperatures which is compatible with the industry's trend toward lower temperatures, and can produce conformal thin film layers. he existing method for depositing multi-component films, such as a $Hf_xSi_yO_2(x+y=1)$ film, using an ALD processes is to deposit laminate films of $HfO_2$ and $SiO_2$ film using a sequential vapor deposition method. That is, the precursor chemicals are not mixed, and instead an Hf containing precursor and a Si containing precursor are pulsed independently and sequentially into the chamber to form laminate layers of HfO and $SiO_2$, respectively. In fact, any mixing of precursors is prohibited, and the chamber is purged of one precursor before the second precursor is pulsed. Once the laminate films are formed to a desired thickness, the film is annealed in an attempt to arrive at more continuous composition throughout the film. This approach of building up layers of different laminate films leads to many electron traps in the film due to the multiple interfaces which requires high temperature thermal anneal to fix the traps. The addition of the high temperature thermal annealing step increases cost and time for manufacturing semiconductors, and moreover can result in the undesirable out migration of elements from previously formed layers on the wafer. In addition, it is difficult to control the stoichiometric composition of multi-component films in the laminate method. The dielectric constant (k), crystallization temperature and refractive index of HfSiOx films cannot be easily controlled by the traditional one chemical sequential precursor pulse methods (such as the laminate method). Furthermore, the cycle times needed to form a film of desired thickness using the conventional sequential pulse and purge of one chemical precursor at a time are impractical and require too much time for future IC manufacturing.

Attempts to fabricate a multi-component films using mixed precursors have been limited to the traditional CVD methods. For example, U.S. Pat. Nos. 6,537,613 and 6,238,734 both to Senzaki et al. (the '613 and '734 patents) generally disclose system and methods for generating a compositional gradient comprising a metal and metalloid compound by direct liquid injection. In direct liquid injection (DLI), the metal and metalloid precursors are mixed together to form a solventless liquid mixture prior to injection of the mixture into the deposition system.

There are however several drawbacks associated with the method described in the '613 and '734 patents. Specifically, it is a liquid mixture that is injected. As such, if the liquid mixture is not thoroughly mixed, a film having an uneven composition and gradient will form on the substrate. In addition, even if appropriate volumes of samples are provided, there is no guarantee that the mixture will vaporize uniformly since each precursor has a unique boiling point, vapor pressure and volatility. Furthermore, if the discrepancy in boiling points between the precursors is substantial, one precursor may decompose at the boiling point of the second forming particulates or contaminants. Generally, either the precursors have not been adequately mixed, resulting in a non-uniform film composition, or mixing of the two vapors causes pre-reaction in the gas phase, resulting in the formation of particles or contaminants that are deposited on the wafer.

Accordingly, there is a need for further developments in methods of fabricating multi-component films. There is particularly a need for a method of fabricating multi-component films using an ALD process. It is further desirable that the method provides control of the stoichiometric composition or gradient of a multi-component film.

BRIEF SUMMARY OF THE INVENTION

In general, the inventors have discovered a method that provides for mixing vaporized precursors such that a mixture of vaporized precursors are present together in a chamber during a single deposition or pulse step in an atomic layer deposition (ALD) process to form a multi-component film. The vaporized precursors are each comprised of at least one different chemical component, and such different components will form a mono-layer to produce a multi-component film. The inventors refer to this method as "co-injection ALD." Such a method is a departure from the prior art, where the vaporized precursors are pulsed separately into the chamber in the ALD process to form separate mono-layers containing only one of the components.

One aspect of the present invention provides systems and methods for fabricating multi-component dielectric films by mixing vaporized precursors together and then injecting or co-injecting the vaporized precursors such that a mixture of precursors are present in the ALD chamber. As used herein the term "muti-component" film means that the film contains two or more metal or metalloid elements. A variety of multi-component films may be formed by the present invention, including but not limited to: metal, metal alloy, mixed metal oxides, silicates, nitrides, oxynitrides, and mixtures thereof.

In one embodiment of the present invention, a method of forming a thin film on a surface of a substrate by atomic layer deposition is provided, characterized in that: two or more vaporized precursors each of the precursors containing at least one different chemical component (typically a metal or metalloid element), are conveyed into a process chamber together to form a mono-layer on the surface of the substrate, and said mono-layer contains each of the separate chemical components. In general the term co-injecting is used to mean that two or more precursors having at least one different chemical component are present in a chamber such that a film is produced having multiple components. This may be accomplished by injecting or conveying precursors together in either vapor or liquid state (aerosol) into a process chamber, or mixing the precursors in the process chamber. Mixing of the precursors prior to introduction into the process chamber is preferred, but not required.

In another aspect the present invention provides a system for forming multi-component films. In one embodiment, the system generally includes one or more vaporizers, each vaporizer being coupled to a manifold. The manifold is configured to mix the vaporized precursors generated by the vaporizers. The manifold is coupled to an inlet to a process chamber and the mixed precursors are injected into the chamber through the inlet. In one embodiment the inlet is comprised of an injector, such as a showerhead injector. It is possible that the precursors may be mixed in the injector, and not in a manifold.

In yet another aspect of the present invention, a system and method is provided for forming a multi-component film having a compositional gradient. In one embodiment a method of forming a multi-component film is provided characterized in that two or more vaporized precursors each of the precursors containing at least one different chemical component, are injected into a process chamber together to form a mono-layer on the surface of the substrate, wherein the gas flow rate of each of the vaporized precursors injected into the chamber are selectively controlled such that a desired composition gradient of one or more of the different chemical components is formed in the film.

In a further aspect of the present invention, a dielectric film having a composition gradient is provided comprising: a silicon-rich bottom layer, a nitrogen-rich top layer, and at least one hafnium-rich layer between said top and bottom layers. In one embodiment nitrogen is deposited selectively near or above a silicon substrate—dielectric interface to deter boron diffusion. In further embodiments, it is desirable to provide system and methods for deterring boron diffusion without placing a burden on the equivalent physical oxide thickness of the dielectric and quality of the interface between the silicon and the nitride dielectric, leading, for example, to higher trap densities. In one embodiment, a compositional gradient may be used to "buffer" the dielectric and the substrate. For example, when the substrate is silicon, a first layer is deposited rich in silicon and lesser amounts of a second deposition metal that makes up the dielectric. Atop the first layer, a second layer comprising predominantly a deposition metal that makes up the dielectric is deposited in addition to substantial lesser amounts of silicon. In some embodiments, additional layers can be added to blend the surface properties and chemistries of the adjacent layers. In various embodiments, each layer can be oxidized, reduced, nitridated, or a combination thereof in-situ.

Further, the invention provides systems and methods for fabricating multi-component oxynitride films, wherein a multi-component film is formed by the method described above, and then the film is oxidized at elevated temperatures with an oxidizing reactant selected from the group consisting of ozone, oxygen, peroxides, water, air, nitrous oxide, nitric oxide, N-oxides, or mixtures thereof. Of particular advantage, the oxidation step can be preformed in-situ. Following oxidation, an excited nitrogen source is sequentially conveyed to the process chamber and permitted to react with the oxidized layer at elevated temperatures to form an oxynitride. Again, this step is performed in-situ.

In a preferred embodiment, the invention provides systems and methods for fabricating multi-component oxynitride films by mixing precursors that contain a nitridating reactant into the chamber and carrying our the ALD process at relatively low temperatures. Suitable nitridating agents can be selected from the group consisting of ammonia, deuterated ammonia, $^{15}$N-ammonia, amines or amides, hydrazines, alkyl hydrazines, nitrogen gas, nitric oxide, nitrous oxide, nitrogen radicals, N-oxides, or mixtures thereof.

BRIEF DESCRIPTION OF THE DRAWINGS

Other aspects, embodiments and advantages of the invention will become apparent upon reading of the detailed description of the invention and the appended claims provided below, and upon reference to the drawings in which:

FIG. 6b highlights the XPS spectrum of the 2p region of silicon found in the film. In both spectra, very little or no impurities can be seen.

FIGS. 9a, 9b and 9c show the TEM images of $Hf_{0.58}Si_{0.42}O_2$ films having a dielectric thickness of 2.3 nm, 4.3 nm and 6.5 nm, respectively. In each case, the thickness of the interface measures approximately 1 nm.

FIG. 15 show thin films, fabricated sequentially and in-situ, comprising HfSiOx, HfO2 and HfOxNy or HfSiON layers.

FIGS. 16a and 16b illustrate reaction schemes that describes the two different ways to generate metal, metal alloy or mix metal oxynitrides of the present invention. FIG. 16a shows a relatively high temperature process for generating oxynitrides, wherein the oxidation step precedes the nitridation step. Whereas, in FIG. 16b, the oxidation step is reserved until the film has been nitridated under relatively low temperatures.

FIG. 17 shows the compositional profile below the surface of a typical oxynitride film. Nitrogen concentration is greatest on the surface of the film, and gradually decreases below the surface until the $HfO_2$ layer is reached. With further penetration into the film, the concentration of $HfO_2$ decreases giving away to $HfSiO_x$, until the interfacial layer of the silicon substrate is reached.

DETAILED DESCRIPTION OF THE INVENTION

Figure 1:
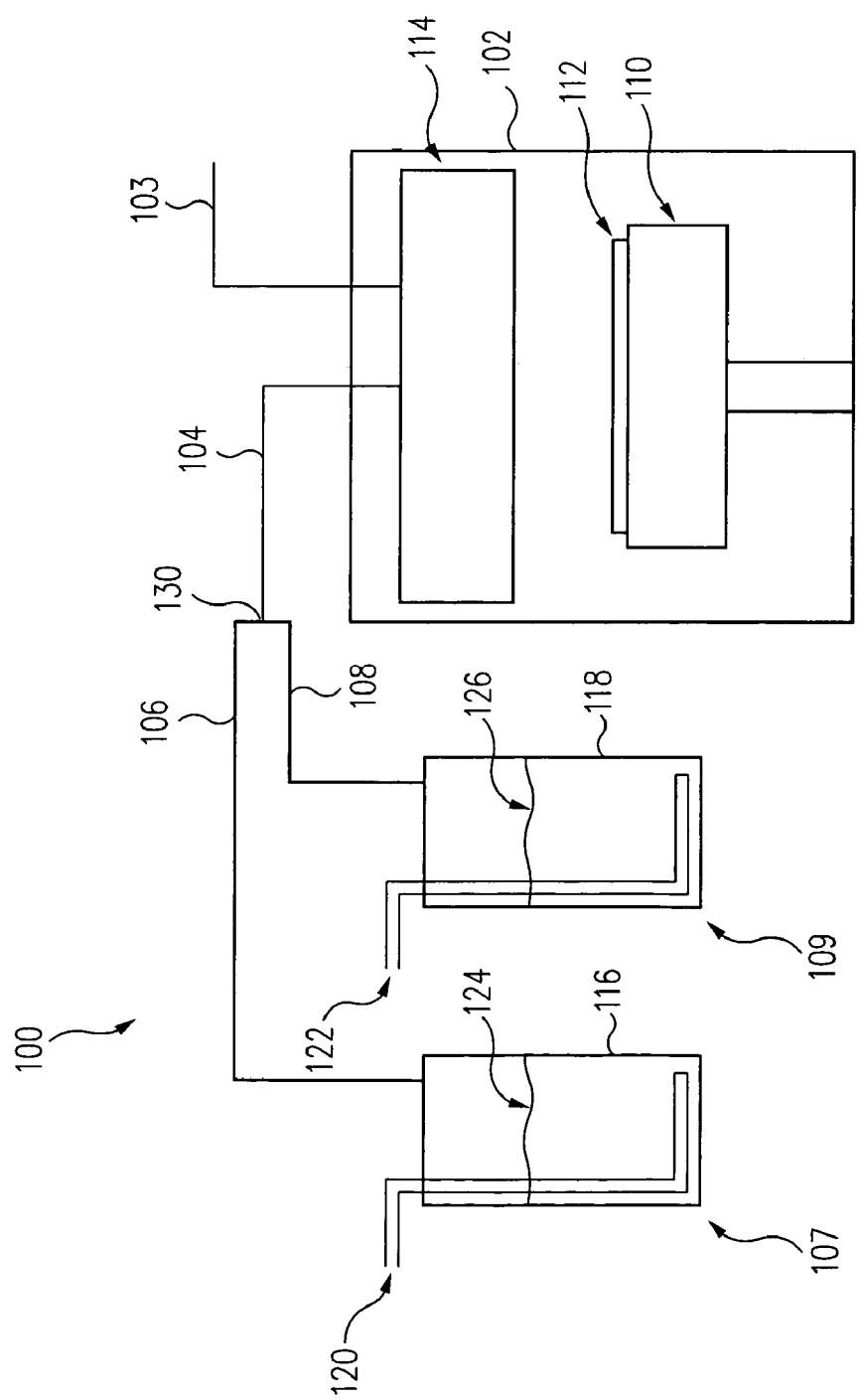
FIG. 1 is a schematic block diagram of an system for fabricating a multi-component, multi-layered film in accordance with one embodiment of the present invention.

In general, the inventors have discovered a method that provides for mixing precursors such that a mixture of precursors are present in a chamber during a single pulse step in an atomic layer deposition (ALD) process to form a mono-layer having multiple chemical compounds on the surface of a substrate. The precursors are comprised of different chemical components, and such components will form the multi-component film. The inventors refer to this method as "co-injection ALD." Such a method is a departure from the prior art, where the vaporized precursors are conveyed or pulsed separately into the chamber in the ALD process. A variety of multi-component films may be formed by the present invention, including but not limited to: metal, metal alloy, mixed metal oxides, silicates, nitrides, oxynitrides, and mixtures thereof.

In one aspect the present invention provides a system and method for reproducibly and substantially uniformly controlling the stoichiometric composition of a multi-component film.

In a series of embodiments, the present invention provides a system and method for fabricating dielectrics possessing a higher permittivity or dielectric constant than silicon dioxide and capable of preventing current tunneling or leakage. In another aspect of the present invention provides a system and method for fabricating an interface that can ameliorate the surface properties and chemistries of the dielectric and silicon substrate, while minimizing the equivalent physical oxide thickness.

Accordingly, in some embodiments and aspects of the present invention, the present invention provides system and methods for depositing nitrogen selectively near or above the silicon substrate—dielectric interface to deter boron diffusion and increase the crystallization temperature of high-k layers. In further embodiments, it is desirable to provide system and methods for deterring boron diffusion without placing a burden on the equivalent physical oxide thickness of the dielectric and quality of the interface between the silicon and the nitride dielectric, leading, for example, to higher trap densities.

In typical embodiments of the present invention, it is desirable to provide a system and method for conducting low temperature nitridation of films; and in another aspect of the present invention, the present invention provides system and methods for delivering a nitrogen reactant sequentially, in-situ, eliminating the need for external plasmas sources and benefiting from less processing steps and time.

In another aspect the present invention provides a system for forming multi-component films. In one embodiment, the system generally includes one or more vaporizers, each vaporizer being coupled to a manifold. The manifold is coupled to an inlet to a reaction or deposition chamber, said inlet being comprised of an injector, such as a showerhead injector, and the like.

Each vaporizer holds a single deposition precursor comprising at least one deposition metal. Each vaporizer is connected to a mass flow controller and temperature control unit. The mass flow controller and temperature unit may be selectively controlled to moderate the concentration of deposition precursors present in the process chamber. In one embodiment, each mass flow controller moderates the flow of carrier gas through the system, and, in turn, the carrier gas dilutes and transports the deposition precursor into the manifold or process chamber.

In some series of embodiments, the vaporizer is a bubbler that vaporizes a single deposition precursor comprising at least one deposition metal. A pressurized gas including the carrier gas is bubbled into the deposition precursor. The flow rate of the pressurized gas may be selectively controlled to adjust the concentration of the deposition precursor present in the process chamber.

In one embodiment, a manifold facilitates mixing of the deposition precursors prior to delivery into the process chamber. In some embodiments, the manifold contains a T-junction cavity that accommodates and mixes the deposition precursors prior to delivery into the process chamber. The manifold may be heated to facilitate the flow of deposition precursors into the process chamber so as to prevent condensation in the manifold. Alternatively, mixing of the precursors may take place in the process chamber and the manifold may be eliminated.

The deposition precursor is delivered to the process chamber typically via a gas inlet and a monolayer of deposition precursor is chemi and/or physi absorbed on the surface or the substrate. The substrate can be silicon, metal, metal alloy, glass or polymeric, plastic, organic or inorganic work pieces. The gas inlet may take a variety of forms. In one example the gas inlet is comprised of an injection, such as a showerhead injector and the like. Alternatively, the deposition precursor is delivered to the substrate surface by a plurality of injectors.

Generally, the substrate is supported on a wafer support such as an electrostatic or vacuum chuck during deposition when a single wafer chamber is used. In one embodiment, the chuck is capable of cooling or heating the substrate by conduction, convection, radiative or non-radiative processes, or a mixture thereof. Alternatively, a the wafer support may be a boat or cassette which supports a plurality of substrates for batch processing.

An inlet port switchably provides oxidizing, reducing or nitridating reactants into the process chamber in-situ so as to promote sequential oxidation, reduction or nitridation of the monolayer or substrate surface.

In another aspect of the present invention, a dielectric film having a composition gradient is provided comprising: a silicon-rich bottom layer, a nitrogen-rich top layer, and at least one hafnium-rich layer between said top and bottom layers. In one embodiment nitrogen is deposited selectively near or above the silicon substrate—dielectric interface to deter boron diffusion. In further embodiments, it is desirable to provide a system and method for deterring boron diffusion without placing a burden on the equivalent physical oxide thickness of the dielectric and quality of the interface between the silicon and the nitride dielectric, leading, for example, to higher trap densities.

The invention further provides a system and method for fabricating multi-component oxynitride films, wherein the multi-component film is formed by the method described above, and then the film is oxidized at elevated temperatures with an oxidizing reactant selected from the group consisting of ozone, oxygen, peroxides, water, air, nitrous oxide, nitric oxide, $H_2O_2$, N-oxides, or mixtures thereof. Of particular advantage, the oxidation step can be preformed in-situ. Following oxidation, an excited nitrogen particle is sequentially conveyed to the process chamber and permitted to react with the oxidized layer at elevated temperatures to form an oxynitride. Again, this step is performed in-situ.

The invention provides a system and method for fabricating multi-component oxynitride films by mixing precursors that contain a nitridating reactant into the chamber and carrying our the ALD process at relatively low temperatures. Suitable nitridating agents can be selected from the group consisting of ammonia, deuterated ammonia, $^{15}$N-ammonia, amines or amides, hydrazines, alkyl hydrazines, nitrogen gas, nitric oxide, nitrous oxide, nitrogen radicals, N-oxides, atomic nitrogen or mixtures thereof.

Of particular advantage, he multi-component film of the invention is formed with a compositional gradient. A compositional gradient may be used to "buffer" the dielectric and the substrate. For example, when the substrate is silicon, a first layer is deposited rich in silicon and lesser amounts of a second deposition metal that makes up the dielectric. Atop the first layer, a second layer comprising predominantly a deposition metal that makes up the dielectric is deposited in addition to substantial lesser amounts of silicon. In some embodiments, additional layers can be added to blend the surface properties and chemistries of the adjacent layers. In various embodiments, each layer can be oxidized, reduced, nitridated, or a combination thereof in-situ. The composition gradient also provides refractive index gradient in the films, which provide unique optical properties of the films.

FIG. 1 is a simplified schematic diagram depicting a one embodiment of a system for fabricating a multi-component film in accordance with one embodiment of the present invention. Referring to FIG. 1, in general the system 100 comprises a process chamber 102 which houses wafer support 110 for supporting a wafer or substrate 112. A gas inlet 114 is provided for conveying deposition precursors and other gases 103 (for example, reactant gases such as oxidation gases and the like, or dilution gases) into the chamber 102 to form various layers or films on the surface of the substrate. In the illustrative embodiment, a gas manifold 104 interconnects one or more vaporizers 107, 109 to the process chamber 102. The illustrative embodiment shows two vaporizers however, any number of vaporizes may be employed. Each vaporizer comprises a reservoir 116, 118 for holding a deposition precursor or a mixture of deposition precursors 124, 126, respectively, and a vaporizer element 120, 122 through which a carrier gas is flowed to assist in vaporizing the contents in reservoirs 116,118. The flow of carrier gas into the vaporizers may be adjusted using a mass flow controller (not shown) to control the rate and concentration of the deposition precursors vaporized. Optionally, each vaporizer may be equipped with a heating element (not shown) to facilitate vaporization of the deposition precursors 124, 126 held in reservoirs 116, 118. Depending on the physical characteristics of the deposition precursors 124, 126, a combination of carrier gas and heating may be required to vaporize the deposition precursors in reservoirs 116, 118.

In one embodiment of the present invention, deposition precursors comprising at least one deposition metal are used having the formula:

$$M(L)_x$$

where M is a metal selected from the group consisting of Ti, Zr, Hf, Ta, W, Mo, Ni, Si, Cr, Y, La, C, Nb, Zn, Fe, Cu, Al, Sn, Ce, Pr, Sm, Eu, Th, Dy, Ho, Er, Tm, Yb, Lu, Ga, In, Ru, Mn, Sr, Ba, Ca, V, Co, Os, Rh, Ir, Pd, Pt, Bi, Sn, Pb, Tl, Ge or mixtures thereof; where L is a ligand selected from the group consisting of amine, amides, alkoxides, halogens, hydrides, alkyls, azides, nitrates, nitrites, cyclopentadienyls, carbonyl, carboxylates, diketonates, alkenes, alkynes, or a substituted analogs thereof, and combinations thereof; and where x is an integer less than or equal to the valence number for M.

It is beneficial to select the ligands (L) to be the same in each of the deposition precursors to avoid ligand exchange from taking place when each of the precursors is mixed in vaporous form. Ligand exchange can lead to the formation of particulates that can adversely effect the quality of the deposited film. Ligands that do not undergo ligand exchange in vaporous form are also suitable.

In one preferred embodiment two deposition precursors are selected, a first deposition precursor where M is hafnium and a second deposition precursor where M is silicon. Both the first and second deposition precursor have the same ligands (L) to avoid ligand exchange from taking place when the first and second deposition precursor are mixed. Suitable ligands include, but not limited to, dimethylamine, diethylamine, diethyl methyl amine or tert-butoxide.

The hafnium source may comprise any one or combination of hafnium dialkyl amides, hafnium alkoxides, hafnium dieketonates, hafnium chloride (HfCl4), tetrakis(ethylmethylamino) hafnium (TEMA-Hf), and the like. The silicon source may comprise any one or combination of aminosilane, silicon alkoxides, silicon dialkyl amides, silane, silicon chlorides, tetramethyldisiloxane (TMDSO), tetrakis(ethylmethylamino) silicon (TEMA-Si), and the like. In one preferred embodiment, the liquid precursors 124, 126, are comprised of TEMA-Hf and TEMASi, respectively.

Deposition precursors are typically vaporized with a vaporizer. Each vaporizer holds a single deposition precursor. Each vaporizer is connected to a mass flow controller and a heating mechanism. As described above according to one embodiment of the present invention, a compositional gradient of one or more of the chemical components in the deposited film is provided. In one example, selective control of the composition is achieved by controlling the amount of precursor that is vaporized. The amount of precursor vaporized is generally controlled by adjusting the gas flow controller and/or the temperature unit which heats the vaporized in order to vaporize a desired concentration of the selected precursor(s). Additionally or alternatively, a dilution gas may be conveyed into the injector 114 or manifold 104 (not shown) and the flow rate of the dilution gas may be selectively controlled to dilute the amount of deposition precursor conveyed to the chamber 102.

The vaporizer may be comprised of a bubbler that vaporizes the deposition precursor comprising at least one deposition metal. When the vaporizer is a blubber, pressurized gas such as a carrier gas is bubbled into the deposition precursor reservoir 116, 118. Useful carrier gases include nitrogen, argon, or helium gas. The pressurized gas dilutes and carries the deposition precursors into their respective deposition precursor conduits 106, 108, and facilitates mixing of the deposition precursors. Optionally, to provide a compositional gradient in the film the concentration of one or more of the deposition precursors can be operable controlled by varying the temperature of the bubbler to selective increase or decrease the amount of deposition precursor vaporized. Temperature control can be conducted independently or in tandem with control of the mass flow controller and/or with the flow rate of the carrier gas. Thus, each of the various control mechanism can be used independently, or in a variety of combinations.

In other embodiments, due to the nature of the deposition precursors, the deposition precursors can be volatilized in reservoir 107, 109 by photolysis or enzymatic or chemical catalysis.

Referring again to FIG. 1, after the deposition precursors 124, 126 are vaporized, the deposition precursors 124, 126 are conveyed into manifold 104 through deposition precursor conduits 106, 108. The deposition precursor conduits 106, 108 can be of any shape, size, and length. The conduits 106, 108 can be fabricated from metal, plastics, polymers, or alloys. Typically, the conduits are made of the same material as the manifold 104. Similar to the manifold 104, the conduits 106, 108 can be insulated or heated to facilitate vaporization. Optionally, the conduits 106, 108 and the manifold 104 contain a sampling region for measuring the vapor concentration and composition spectroscopically or spectrometrically.

Mixing of the precursors can be facilitated by gravity or pressurized gas. Mixing can also be achieved by physical means such as a plunger to forcibly inject the precursors 124, 126 into manifold 104 through conduits 106, 108, where precursors 124, 126 are permitted to mix into a homogeneous deposition mixture. In some embodiments, the conduits 106, 108 converge and terminate at T-junction 130 in manifold 104, where precursors 124, 126 mix prior to delivery into process chamber 102.

Alternatively, conducts 106, 108 can converge and convey the respective precursors directly into a mixing region or cavity near or inlet to the chamber 102. In some embodiments, a filter can be inserted or attached to the manifold 104 to remove unwanted or isolate particular impurities and gases.

Optionally, referring back to the manifold 104 and conduits 106, 108, a heating or cooling element internally embedded or externally located can be used to regulate mixing and minimize particulate and impurity formation in the films.

The manifold 104 may take many forms suitable for mixing of the precursors prior to conveying the precursors to the chamber 102. The manifold 104 may be a single conduit coupled to the vaporizers via a junction, such as T-junction 130. The manifold 104 may include a cavity or reservoir to provide some residence time for the precursors to mix. In an alternative embodiment the manifold may be eliminated altogether, and the deposition precursors are conveyed directly to the gas inlet 114 and mixed in the gas inlet 114 (such as when the gas inlet is comprised of an injector) as they are conveyed into the chamber 102.

Still referring to FIG. 1, once the precursors 124, 126 have been vaporized, the deposition precursors 124, 126 are conveyed to the chamber 102 via one or more gases inlets 114. The gas inlet may take a variety of forms for delivery of gases to the chamber. In one embodiment, the gas inlet is comprised of an injector, such as a showerhead. It is also within the scope of the invention to incorporate a showerhead that utilizes a plurality of injectors adjustable in the process chamber 102 to provide desirable films. While the illustrative embodiment shows a single wafer chamber having one gas inlet 114, the present invention may be employed with a batch processing chamber, or with a mini-batch chamber. In a batch or mini-batch chamber, a plurality of gas inlets are employed and the gases are typically conveyed over each substrate in a parallel or cross-flow manner. Examples of a mini-batch chamber are described in PCT patent application serial no. PCT/US03/21575 entitled Thermal Processing System and Configurable Vertical Chamber, the disclosure of which is incorporated by reference herein.

A layer of the deposition mixture, comprising precursors 124, 126, is deposited on substrate 112. Suitable substrates include metal, metal alloy, glass, polymeric, plastic, organic or inorganic work pieces. Depending on the mode of deposition, a monolayer or monolayers of the deposition mixture will form on substrate 112. The preferred method for deposition is Atomic Layer Deposition. However, the system and method of the present invention may be employed with other deposition techniques.

Referring again to FIG. 1, following deposition of the deposition mixture, excess mixture is purged out of the system through an exhaust port connected to a vacuum pump that controls the system pressure, gas flow and insures rapid purging of the process chamber 102 after each deposition process. The wafer support 110 is used to support and heat the substrate during a deposition or annealing step. The wafer support typically contains heating and cooling elements formed therein. An external heater (not shown) may also be used to control the temperature of the process chamber. Preferably, the wafer support 110 is a vacuum or electrostatic chuck.

Process chamber 102 has an inlet 103 switchably and sequentially capable of supplying other gases used in the process or in cleaning of the chamber. Reactant gases may be conveyed into the chamber via inlet 103. Suitable reactant gases include oxidizing gas, reducing gas, nitridating gas, or mixtures thereof. Other gases which may be conveyed through inlet 103 include carrier or inert gas, or mixtures thereof.

In one preferred embodiment, vaporized deposition precursors are mixed in a manifold prior to introduction into the reaction chamber in order to provide a more uniform film and to permit maximum control of the composition of the film. However, it is possible to separately convey each vaporized precursor to a gas inlet, such as an injector and the like, which mixes the gases as they are injected into the chamber, thus eliminating the need for a separate manifold. A variety of mechanical embodiments are suitable in light of the teaching of the present invention, and the present invention is not limited to any one mechanical configuration. The teaching of the present invention provides that at least some mixing of the various different precursors takes place such that a mixture of precursors having different chemical components is present in the process chamber to form a film having multiple components in one mono-layer.

A reactant gas may be introduced into the process chamber 102 through inlet 103, to treat and/or react with the monolayer comprising the deposition mixture on the surface of the substrate 112. Reactant gases can be supplied sequentially or simultaneously mixed with the deposition precursors in the gas inlet 114 or directly into the process chamber 102.

A variety of reactant gases may be used depending on the application. If the reactant gas is an oxidizing gas, the monolayer is oxidized. If the reactant gas is a reducing gas, the monolayer is reduced. Similarly, if the reactant gas is a nitridating gas, the monolayer is nitridated. Suitable oxidizing gases include ozone, oxygen, singlet oxygen, triplet oxygen, water, peroxides, air, nitrous oxide, nitric oxide, $H_2O_2$, and mixtures thereof. Suitable reducing gases include hydrogen. Suitable nitridating gases include ammonia, deuterated ammonia, $^{15}N$-ammonia, hydrazine, alkyl hydrazines, nitrogen dioxide, nitrous oxide, nitrogen radical, nitric oxide, N-oxides, amides, amines, or mixtures thereof. In another embodiment, after the deposition precursor has been deposited on substrate 112, substrate 112 can be transferred in vacuum to a second processing unit capable of nitridating, oxidizing, reducing, or annealing the monolayer on substrate 112.

In one example, to form a multi-component film comprising HfSiN by ALD, a hafnium and silicon deposition precursors (for example: TEMA-Hf and TEMA-Si, respectively) are vaporized, mixed and conveyed (also referred to as "pulsed) to the process chamber together, along with a nitrogen containing source such as $NH_3$ to form HfSiN. The process may be carried out where the Hf and Si deposition precursors are mixed together and pulsed into the process chamber, then purged. The nitrogen source gas (such as $NH_3$) is pulsed and purged. These steps form one ALD cycle to form the HfSiN film. In another embodiment, a further pulse and purge step is performed with an oxidizing agent, such as ozone, in one ALD cycle to form a HfSiON film.

In one example the ALD process is carried out at a process temperature in the range of approximately 25 to 800° C., more usually in the range of approximately 50 to 600° C., and most usually in the range of approximately 100 to 500° C. The pressure in the process chamber is in the range of approximately 0.001 mTorr to 600 Torr, more usually in the range of approximately 0.01 mTorr to 100 Torr, and most usually in the range of approximately 0.1 mTorr to 10 Torr. This pressure range covers both the pulse and purge steps. The total inert gas flow rate in the process chamber, including the carrier gas in the bubblers when used, is generally in the range of approximately 0 to 20,000 sccm, and more usually in the range of approximately 0 to 5,000 sccm.

Optionally, after the deposition precursor has been deposited on substrate 112, substrate 112 can be transferred in vacuo to a second processing unit capable of nitridating, oxidizing, reducing, or annealing the monolayer on substrate 112.

Figure 2:
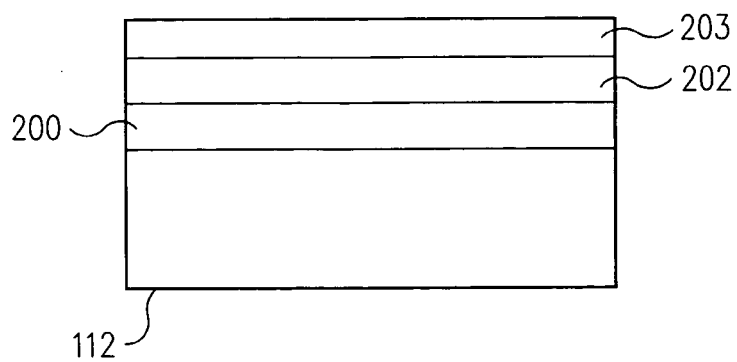
FIG. 2 is a cross-sectional view of a high k dielectric gate material formed utilizing system and methods of the present invention.

FIG. 2 illustrates a cross-sectional view of a multi-layered gate dielectric of the present invention. The first layer 200 is selected to promote desired properties of high mobility (faster transistor speed) and a stable interface against substrate 112. Suitably, the first layer is a metal silicate or oxide having a high dielectric constant. Preferably, the first layer is a silicon-rich metal silicate. The silicon component in metal silicates of the first layer reduces the formation of interfacial defects by mitigating the incompatibility between pure metals or metal oxides and the interfacial silicon dioxide residue on substrate 112. The metal component in the metal silicate serves to enhance the dielectric properties of the first layer. Suitable metal, metal alloy or mix metal oxides, nitrides, silicates or oxynitrides of the present invention include, but not limited to, Ti, Zr, Hf, Ta, W, Mo, Ni, Si, Cr, Y, La, C, Nb, Zn, Fe, Cu, Al, Sn, Ce, Pr, Sm, Eu, Th, Dy, Ho, Er, Tm, Yb, Lu, Ga, In, Ru, Mn, Sr, Ba, Ca, V, Co, Os, Rh, Ir, Pd, Pt, Bi, Sn, Pb, Tl, Ge or mixtures thereof.

Figure 3:
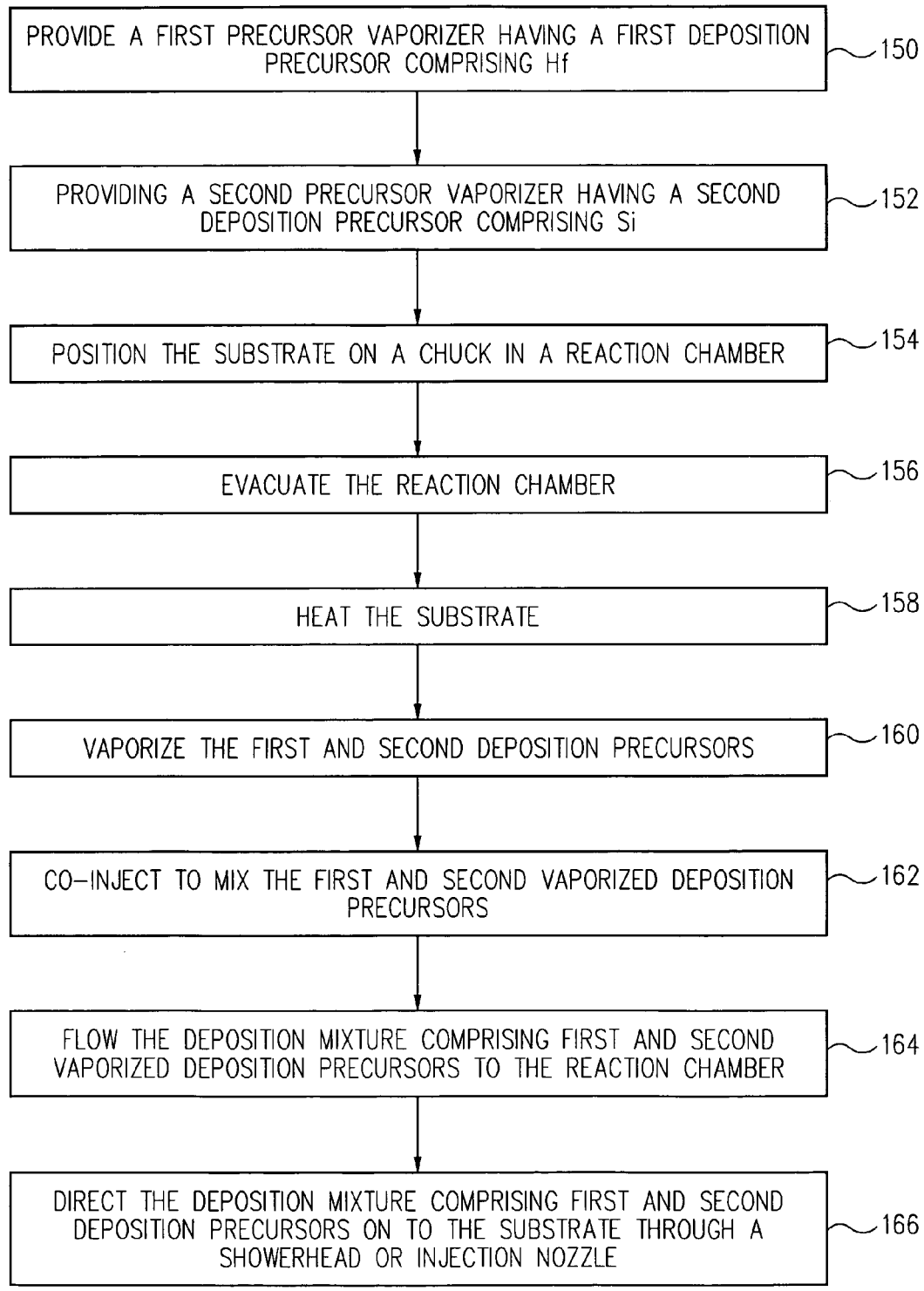
FIG. 3 is a flow chart illustrating the method for fabrication of the compositional gradient films according to one embodiment of the present invention.

One embodiment of the method of the present invention is illustrated in the flowchart of FIG. 3. This example is shown for illustration purposes only and is not meant to limit the invention in any way. In the exemplary embodiment, a first precursor vaporizer is provided having a first precursor comprising Hf (Step 150). A second precursor vaporizer having a second precursor comprising Si is also provided (Step 152). The substrate or wafer is positioned on the chuck in the reaction chamber (Step 154), the process chamber is evacuated (Step 156), and the substrate heated to a predetermined processing temperature (Step 158). As noted above the process temperature is preferably from approximately 50 to 800° C., and more preferably from approximately 100 to 500° C. The first and second precursors are vaporized by bubbling a gas through the reservoirs to form first and second vaporized precursors (Step 160), mixed (Step 162), and flowed to the reaction chamber (Step 164). The mixed first and second vaporized precursors are directed on to the substrate through the gas inlet such as showerhead or injection nozzle (Step 166).

The present invention further provides a multi-component film or layer having a composition gradient as illustrated in FIG. 2. Referring to FIGS. 1 and 2 deposition of first layer 200 onto silicon substrate 112 takes place in process chamber 102. In one example, a film of HfSiO is formed wherein hafnium is vaporized in vaporizer 107, and silicon is vaporized in vaporizer 109. Hafnium and silicon deposition precursor vapors are swept into manifold 104 by a carrier gas. Within the manifold, the deposition precursor vapors are mixed and delivered to gas inlet 114 as a deposition mixture. Gas inlet 114 conveys the disposition mixture to the process chamber 102 and the deposition mixture contacts the surface of a substrate 112 and is absorbed on the surface to form a monolayer of the deposition mixture onto substrate 112. After the process chamber 102 is purged with an inert gas or evacuated under vacuum, ozone gas is sequentially pulsed into process chamber 102 through inlet 103. The reactant gas saturates the monolayer on substrate 112 forming an atomic layer comprising hafnium, silicon and oxygen, where the silicon content is higher than hafnium.

Figure 4:
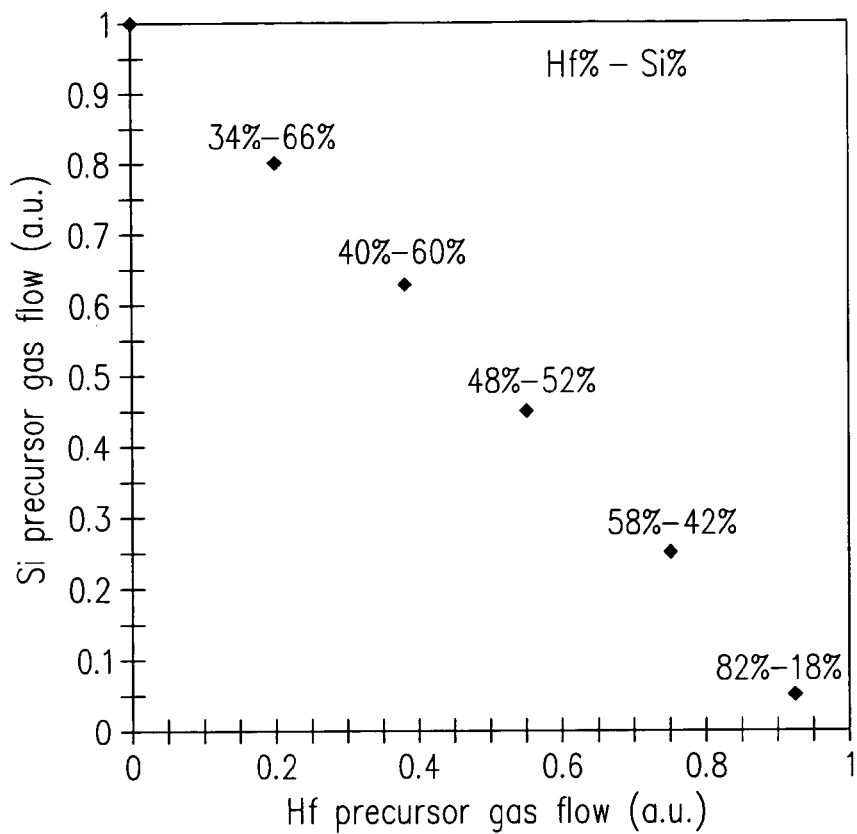
FIG. 4 illustrates the relationship between film composition and the deposition precursor gas flow rates. In this particular example, the deposition and composition of hafnium-silicon films can be modified by controlling the hafnium and silicon deposition gas flow rates.
Figures 5, 6A, 6B:
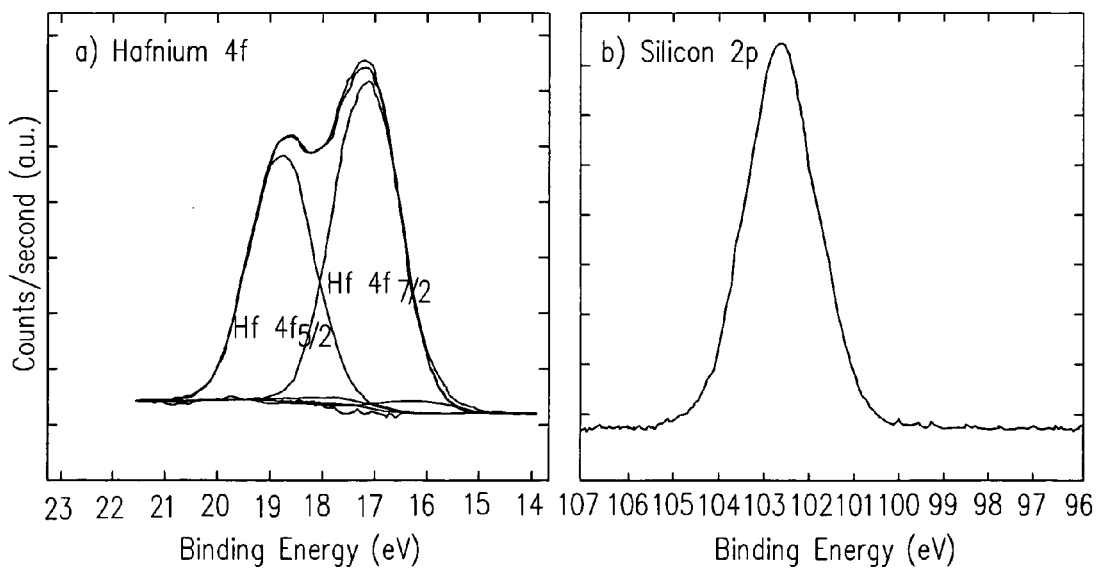
FIG. 5 tabulates the results of the atomic compositional analysis of various HfSiO films fabricated by the system and method of the present invention. The results indicate that over a given hafnium and silicon content concentration, the ratio of oxygen atoms to hafnium and silicon atoms is approximately 2. These results indicate that the HfSiO films fabricated by system and methods of the present invention, over a particular range, affords films having the structural formula $Hf_xSi_{1-x}O_2$. The percentage of carbon, hydrogen and nitrogen is only found in trace amounts.
FIGS. 6a and 6b show X-Ray Photoelectron Spectroscopy (XPS) spectra of a film having the formula $Hf_{0.5}Si_{0.5}O_2$ generated by the system and method of the present invention. In particular, FIG. 6a highlights the XPS spectrum of the 4f region of hafnium found in the film.

FIG. 4 illustrates that by varying the flow of deposition precursors 124 and 126, the concentration of silicon relative to hafnium can be tailored to yield multi-component films. FIG. 5 shows that changes in silicon or hafnium concentration are, for the most part, governed by the formula $Hf_xSi_{1-x}O_2$, where x=0-1.

XPS studies on $Hf_xSi_{1-x}O_2$ films shed light on the bonding arrangement of atoms in the films. FIG. 6a represents the XPS spectrum of hafnium in the film. Based on the intensity of the absorption bands and the magnitude of the bonding energies, hafnium is predominantly found in a silicate form. Very little amount of impurities such as $HfO_2$ is seen in the spectrum. Now referring to FIG. 6b, the XPS spectrum of silicon reveals that silicon also exists predominantly as a silicate with no or very little $SiO_2$ formation. The XPS results highlight the advantages of the present invention. That is, the formation of homogeneous hafnium silicate films with no or minimal patches of $HfO_2$ or $SiO_2$.

Figure 7:
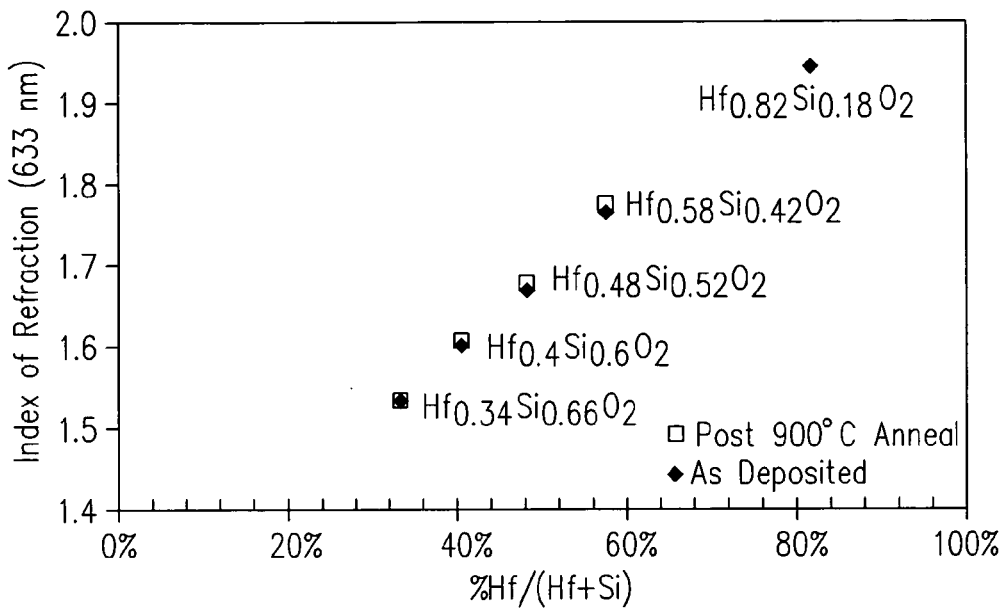
FIG. 7 depicts the index of refraction for various 50 nm thick $Hf_xSi_{1-x}O_2$ films on silicon wafers measured as a function of the Hf/(Hf+Si) ratios. The graph compares the index of refraction for as-deposited and post-deposition annealed films.

Now referring to FIG. 7, refractive indices of dielectric films of the present invention decrease with increasing silicon content. FIG. 7 shows that heating the films in a $N_2$ atmosphere at 900° C. causes no thermal alterations.

Figure 8:
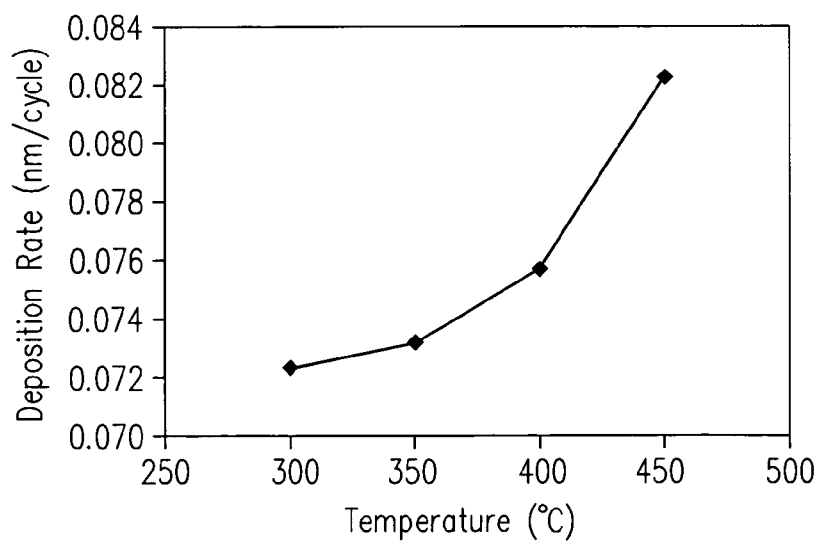
FIG. 8 illustrates the change in deposition rates for $Hf_xSi_{1-x}O_2$ films, resulting from the oxidation of hafnium-silicon films with ozone, with respect to the deposition temperature.
Figure 9A:
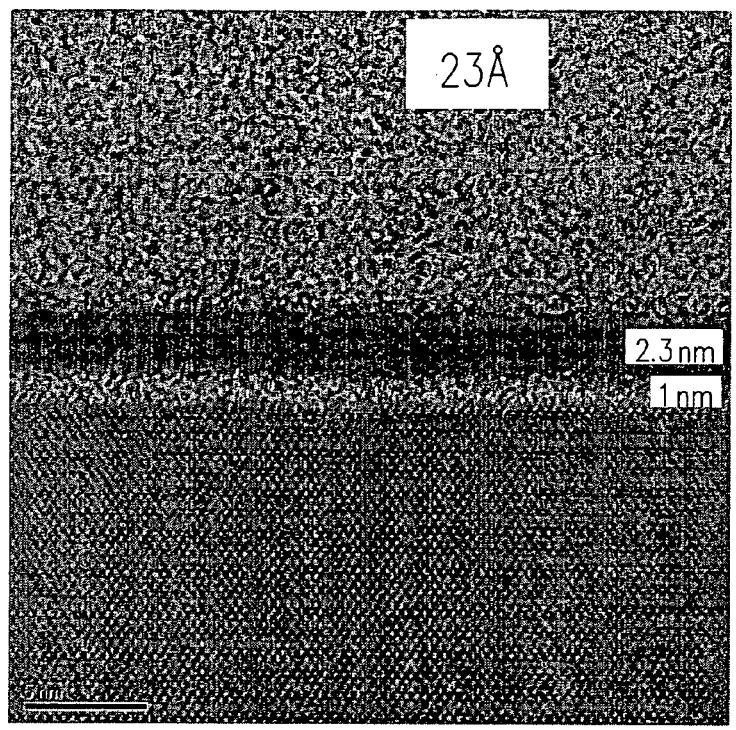
FIGS. 9a-9c shows various TEM cross-sectional images of $Hf_{0.58}Si_{0.42}O_2$ films deposited at 400° C. on HF last treated silicon substrates.
Figure 9B:
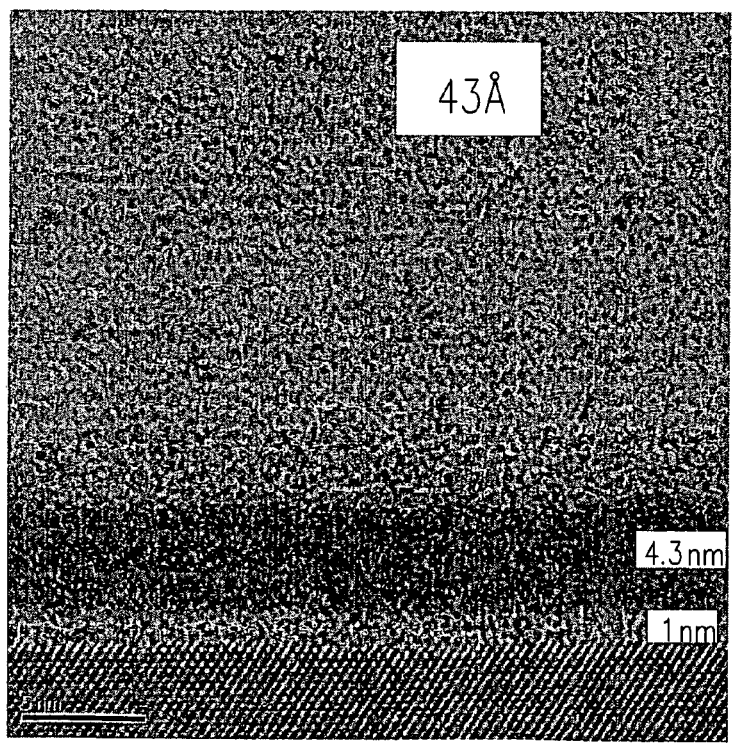
Figure 9C:
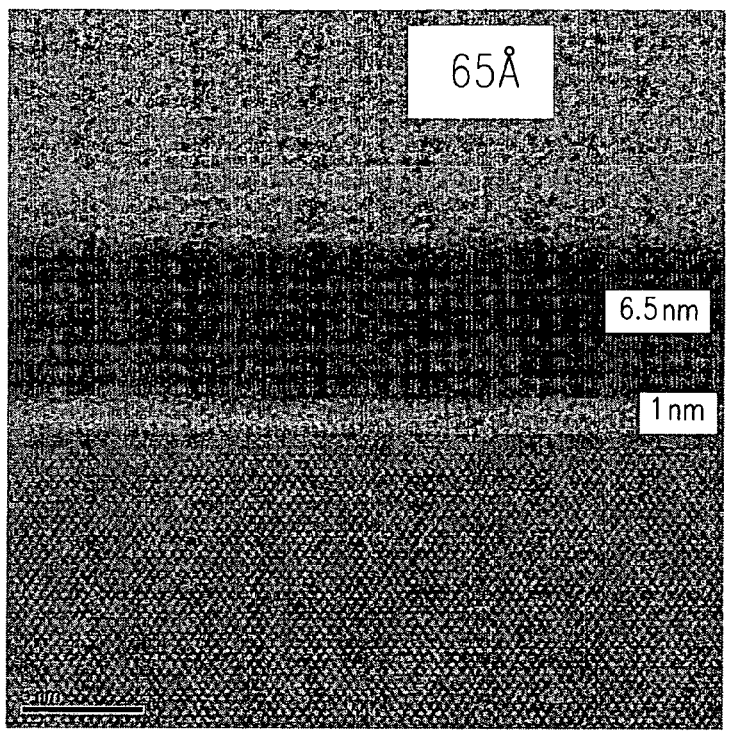

FIG. 8 shows that the rate of deposition is temperature dependent. The rate of linear growth of $Hf_xSi_{1-x}O_2$ increases with temperature. However, above 400° C., the deposition rate increases substantially as the atomic layer deposition (ALD) process adopts a chemical vapor deposition (CVD) mechanism. Cross-sectional Transmission Electron Microscopy (TEM) images of $Hf_{0.58}Si_{0.42}O_2$ film deposited at 400° C. on HF-last silicon substrates, at various thicknesses, show similar interfacial layer thickness measuring approximately 1 nm. Comparing FIGS. 9a, 9b and 9c, each having a dielectric thickness of 2.3 nm, 4.3 nm and 6.5 nm, respectively, the interfacial thickness is independent of the dielectric thickness. This suggests that, when ozone is used as the oxidizing reactant in an ALD process, the oxidation at the interface may take place during the initial stages of film fabrication.

Figure 10:
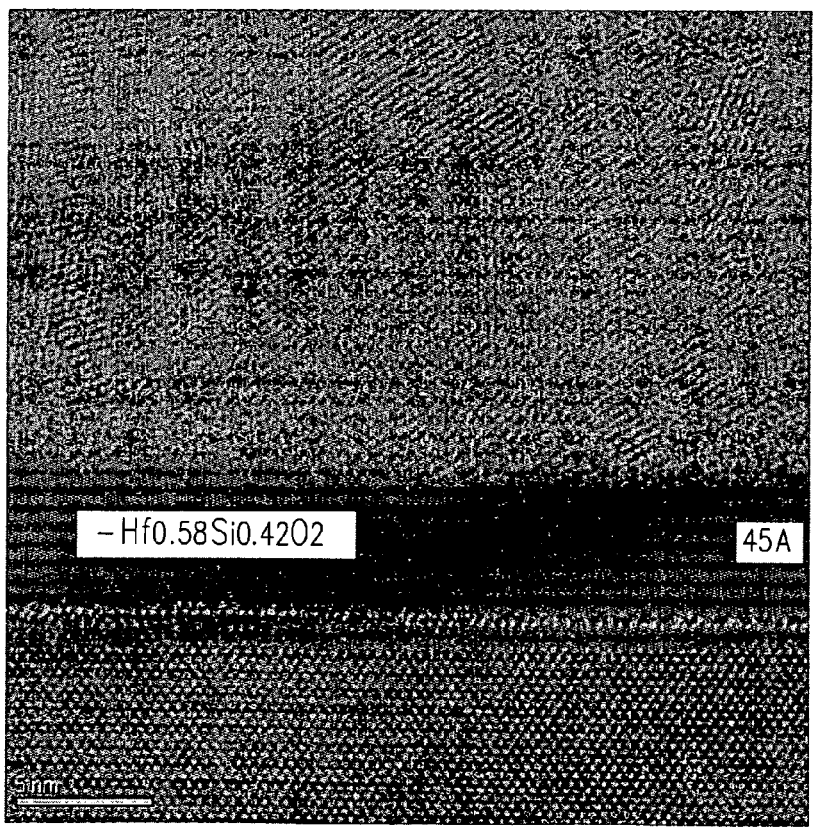
FIG. 10 is cross-sectional TEM image of $Hf_{0.58}Si_{0.42}O_2$ with polysilicon cap layer after an anneal at 700° C. in $N_2$.
Figure 11:
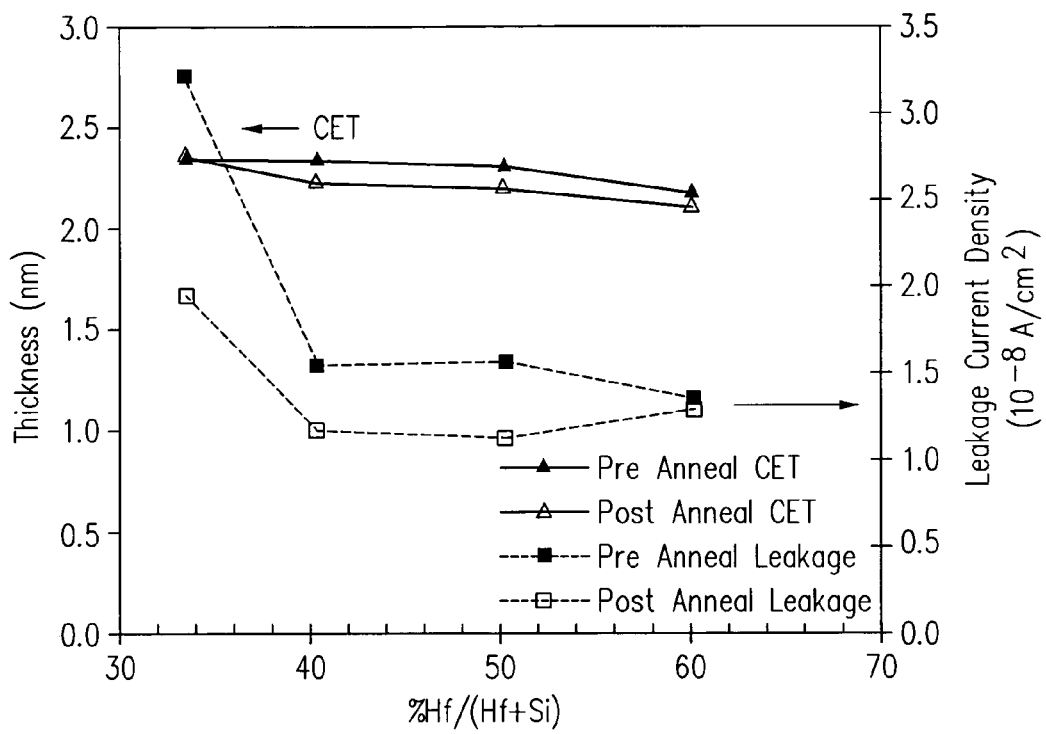
FIG. 11 measures the capacitance equivalent thickness (CET) and the leakage current density as a function of hafnium content for various $Hf_xSi_{1-x}O_2$ films on HF-last silicon wafers.

Although heating at elevated temperatures does not alter the amorphous state of the dielectric, annealing decreases the interfacial oxide layer. FIG. 10 shows a TEM image of the $Hf_{0.58}Si_{0.42}O_2$ film after annealing. Comparing the thickness of the interfacial oxide layer to FIG. 9, annealing seems to reduce the interfacial layer by 0.3 nm without changing either the capacitance-voltage (CV) or current-voltage (IV). FIG. 11 shows that the films are electrically stable to annealing. Neither capacitance-equivalent thickness (CET) nor the low leakage current densities were greatly affected by the annealing step.

Figure 12:
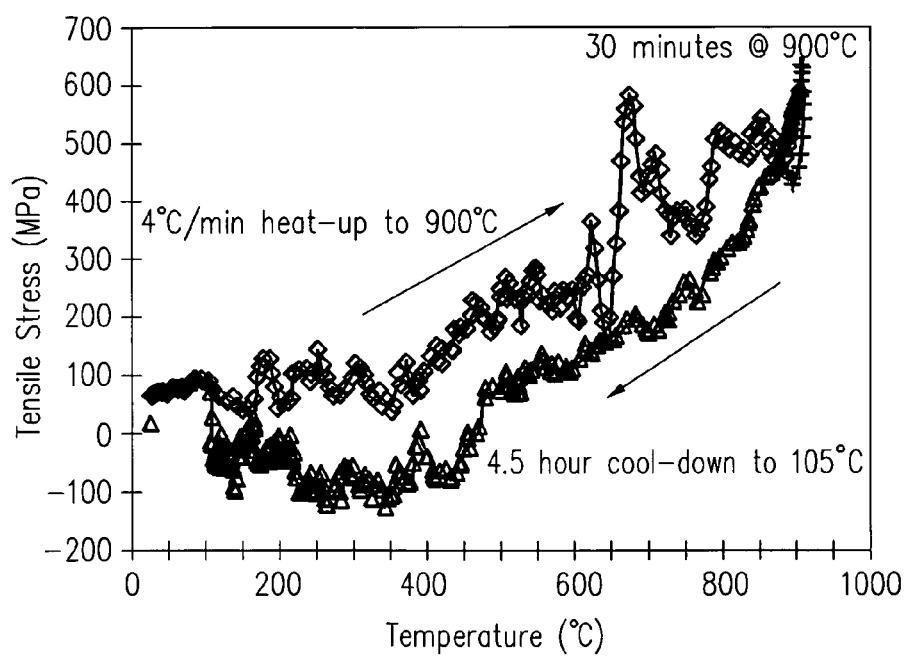
FIG. 12 measures the film tensile stress as a function of temperature for a 50 mm thick $Hf_{0.34}Si_{0.66}O_2$ film.

Stress hysteresis measurement for a 50 nm thick $Hf_{0.34}SiO_{0.66}O_2$ film, during an anneal to 900° C., was monitored. As shown in FIG. 12, the consistent slope during heat-up indicates a fairly stable difference in thermal expansion between the deposited $Hf_{0.34}Si_{0.66}O_2$ film and the silicon substrate. At approximately 700° C., the stress becomes more tensile, indicating a change in morphology to a microcrystalline state. Relative to an $HfO_2$ film, deposited by ALD from TEMAHf and $O_3$ at 300° C., which possesses a stress increase at approximately 450° C. (not shown), the increase in film stress transition temperature in $Hf_xSi_{1-x}O_2$ is attributable to an increase in the silicon content. Thus, an increase in silicon content increases the temperature at which films crystallize.

Suitable source of hafnium include hafnium dialkyl amides, hafnium alkoxides, hafnium diketonates or hafnium halides. Suitable sources of silicon include silicon halides, silicon dialkyl amides or amines, silicon alkoxides, silanes, disilanes, siloxanes, aminodisilane, and disilicon halides. Typically, sources of hafnium and silicon are selected having common ligands to prevent complications arising from ligand exchange. Covalently bridged mixed metals, as disclosed in PCT patent application serial number PCT/US03/22236 entitled Molecular Layer Deposition Of Thin Films With Mixed Components, incorporated herein by reference, as well as non-covalently bonded mixed metals may be used as precursors for deposition. Types of non-covalent bonds include hydrogen bonds, dative bonds, metal-metal bonds, metal-π, metal-π*, π-π bonds, sigma-sigma bonds, ionic bonds, Van Der Waals interactions, hydrophobic/hydrophilic interactions, polar bonds or dipole moment interactions. Sources of inert gases include carrier gases such argon, nitrogen, inert gases, or a mixture thereof.

Again referring to FIG. 2, a second layer 202 is deposited on the first layer 200, wherein the second layer 202 has a greater concentration of hafnium than silicon, i.e., hafnium>silicon. The higher concentration of hafnium ensures that the overall make-up of the dielectric behaves like a high k hafnium dielectric. The presence of silicon in the second layer 202 creates a gradual stoichiometric transition from first layer 200 so that there are no abrupt compositional interfaces between the individual layers that may cause electrical leakage and defects. Subsequent oxidation with ozone affords second layer 202.

In various embodiments of the present invention, a third layer 203 can optionally be deposited comprising primarily hafnium, i.e., hafnium>>silicon, atop second layer 202 to form a stack of dielectric layers having a compositional gradient. Oxidation with an oxidizing reactant yields predominantly hafnium dioxide. Utilizing this approach, a homogeneous film of any gradient, thickness and composition can be fabricated with precision and control.

In another aspect, third layer 203 may be nitridated with a nitridating reactant. The inclusion of nitrogen blocks the diffusion of impurities such as boron through the dielectric, and enhances the long-term performance and reliability of the film.

Figure 13:
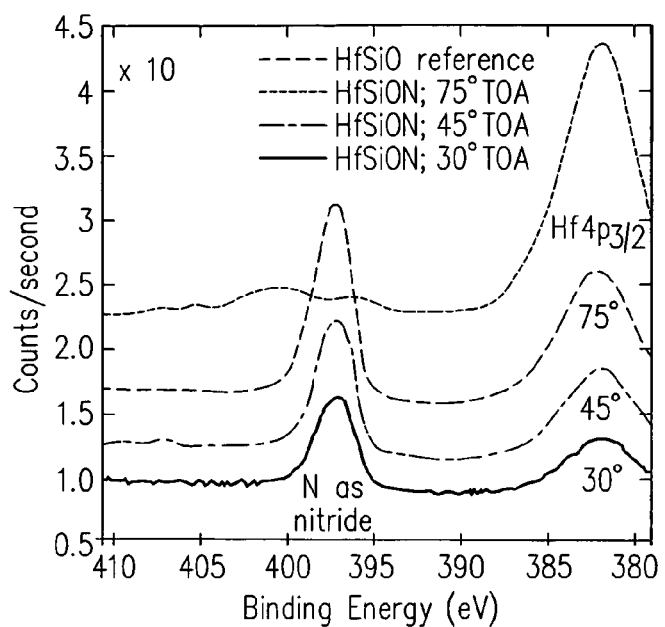
FIG. 13 shows the X-ray Photoelectron Spectroscopy (XPS) spectra for nitrogen 1s and hafnium $4p_{3/2}$ regions for an HfSiO film nitridated with ammonia in a post-deposition annealing step. Relative to HfSiO, the XPS spectra of an HfSiON film at various take-off angles (TOA) reveal the presence of nitrogen in the film.

In some embodiments, third layer 203 can be nitridated thermally in the presence of ammonia gas as a post-deposition annealing step. Whereas, in other embodiments, third layer 203 can be nitridated using high energy nitrogen particles generated remotely with respect to the process chamber 102. In accordance with one aspect of the present invention, FIG. 13 shows an XPS spectrum for an exemplary post-annealed film with ammonia. Relative to a HfSiO reference also shown in FIG. 13, the presence of the nitrogen peak near 400 eV indicates the incorporation of nitrogen into the HfSiO layer. Measurements at various take-off angles (TOA) detect the presence of HfSiON not only at the surface of the dielectric, but as well as deep within the film.

Optionally, if desired, instead of relying on heat to form and anneal the nitride layer, nitridation can be facilitated by light or any combination of light, heat and chemical initiators. For example, in certain embodiments, direct plasma, remote plasma, downstream plasma, ultraviolet photon energy, or a combination thereof, can be used to facilitate nitridation. Activation energy sources include plasma, light, laser, radical, and microwave energy sources, and mixtures thereof.

As previously mentioned in a separate embodiment, suitable nitrogen sources include ammonia, deuterated ammonia, $^{15}$N enriched ammonia, amines, amides, nitrogen gas, hydrazines, alky hydrazines, nitrous oxide, nitric oxide, nitrogen radicals, N-oxides, or a mixture thereof.

Figure 14:
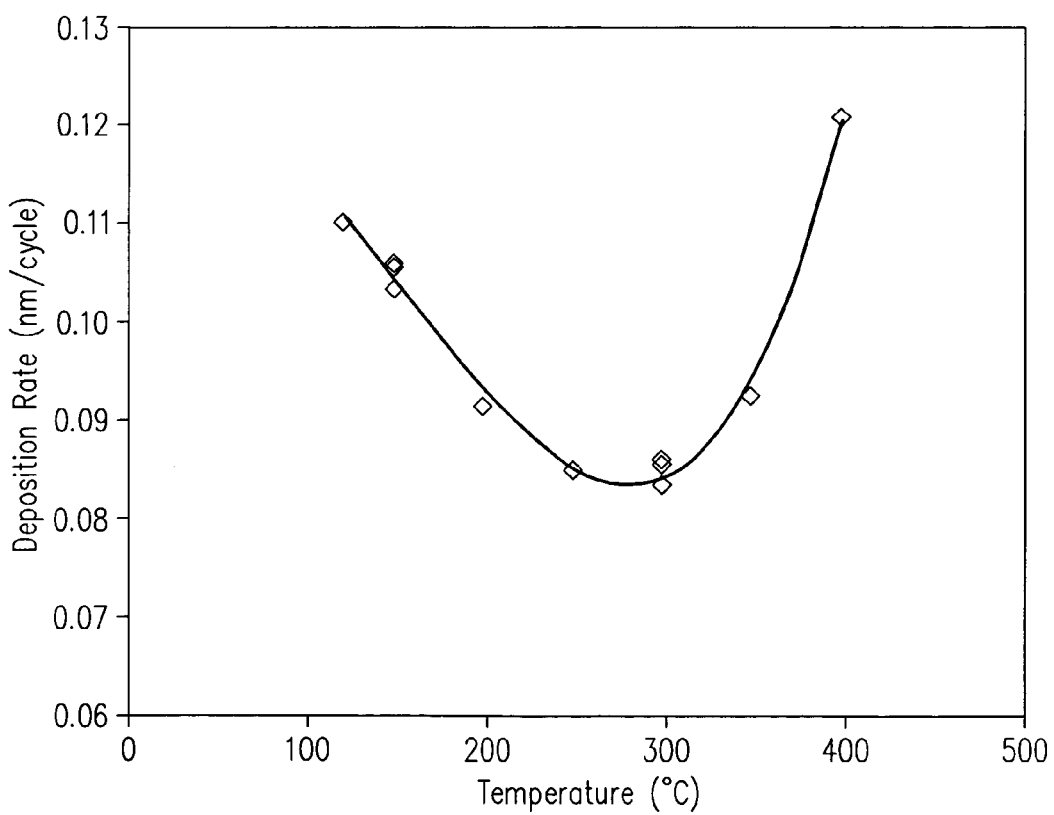
FIG. 14 is a graph of the deposition rate of $HfO_2$, generated from the oxidation of hafnium dialkyl amide with ozone, as a function of deposition temperature.
Figure 15:
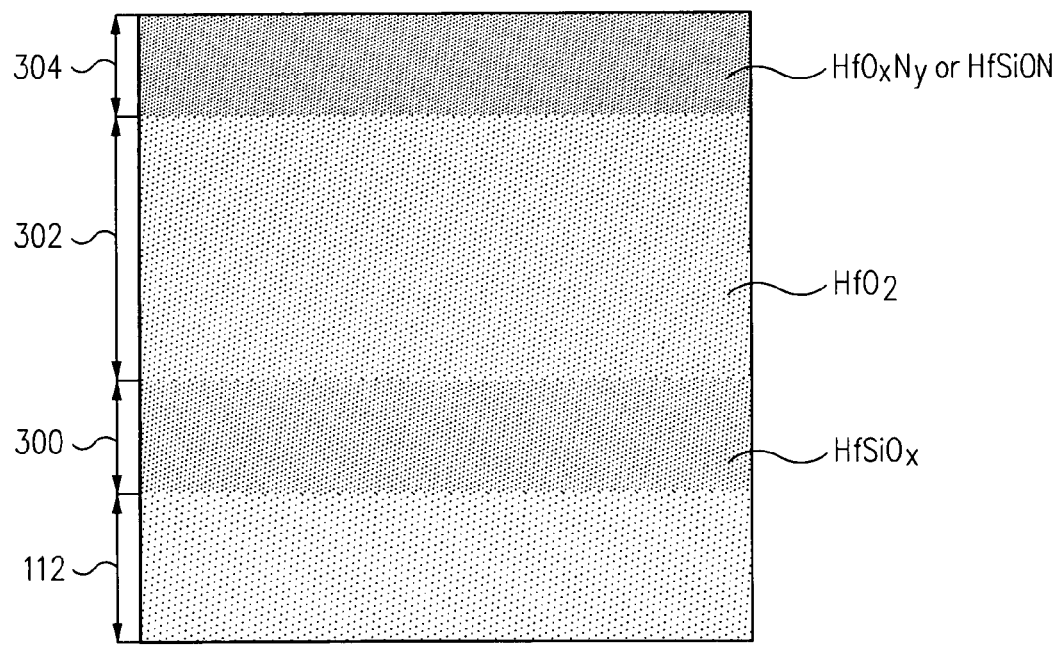
FIG. 15 is a cross-sectional view of a thin film having a compositional gradient formed by the co-injection system and method of the present invention.

In yet another aspect of the present invention, although related to the nitridation of films, an ambient method of nitridating dielectrics is provided. FIG. 14 shows that the rate of $HfO_2$ deposition, arising from the reaction between hafnium dialkyl amide precursors and ozone, increases, surprisingly, with a decrease in reaction temperature. In view of ozone's reactivity toward hafnium dialky amide, HfSiOx 300 was deposited onto substrate precursor 112 as shown in FIG. 14 by vaporizing hafnium and silicon in vaporizers 107 and 109, respectively, of FIG. 1. Ozone is supplied through inlet 103 into the process chamber 102 housing substrate 112. Oxidation occurs rapidly at relatively low temperatures as in FIG. 16a to afford hafnium oxide 302. To protect layer 302 from boron diffusion from the gate electrode, an oxynitride layer 304 is desirable atop metal oxide 302.

There are two methods for depositing oxynitride layer 304. In the first method, as depicted in FIG. 16a, the deposition precursor or precursors 124, 126 are vaporized and injected into process chamber 102 forming a monolayer of deposition mixture on substrate 112.

Now referring to FIG. 16a, despite a low temperature oxidation that affords oxide 302, the subsequently thermal oxynitridation anneal at 800° C. with ammonia is tolerable, yet unfavorable from a process stand point. Structurally, such high annealing temperatures pose a greater concern. That is, the crystallization of oxide layer 302, leading to possible intrinsic defects deep within or at the grain boundaries of oxide 302.

In the preferred embodiment of the present invention, the second method for depositing oxynitride is shown in FIG. 16b. The method in FIG. 16b, relative to the method in FIG. 16a, is a more economical pathway to oxynitride 304. Since ozone reacts readily with metal dialkyl amides, a deposition mixture is first deposited onto substrate 112 and treated in-situ with ammonia sequentially. Following the formation of nitride 303 at relatively low temperatures, oxidation with ozone drives the reaction to completion affording oxynitride 304.

In some embodiments of the present invention, deuterated ammonia or $^{15}$N-ammonia is preferred.

FIG. 17 shows the compositional profile below the surface of oxynitride 304. Nitrogen concentration is greatest on the surface of the film, but gradually decrease below the surface until the $HfO_2$ layer is reached. With further penetration into the film, the concentration of $HfO_2$ 302 decreases giving away to $HfSiO_x$ 300, until the interfacial layer of the silicon substrate 112 is reached.

In accordance with the present invention, numerous layers of HfSiON having different film thickness and nitrogen or oxygen concentration can be deposited. While specific examples describing the formation of $SiO_2$, $HfO_2$, $HfSiO_x$, HfN, SiN, SiON and HfSiON are shown herein, it will be apparent to those of ordinary skill in the art that the inventive method and ALD system may be employed to generate any thickness, composition, or types of thin films comprising metal, metal alloys or mix metals oxides, silicates, nitrides, oxynitrides, or combinations thereof.

The foregoing description of specific embodiments of the invention have been presented for the purpose of illustration and description. They are not intended to be exhaustive or to limit the invention to the precise forms disclosed, and obviously many modifications, embodiments, and variations are possible in lights of the above teaching. It is intended that the scope of the invention be defined by the claims appended hereto and their equivalents.

What is claimed:

1. A dielectric film having a composition gradient comprising:
   a silicon-rich metal silicate bottom layer;
   a nitrogen-rich top layer;
   at least one hafnium-rich layer formed between said top and bottom layer; and
   wherein each said silicon-rich metal silicate bottom layer, said hafnium-intermediate layer and said nitrogen-rich top layer comprise at least one common compositional element.

2. A dielectric film having a composition gradient comprising:
   a silicon-rich first layer;
   a second layer formed atop the first layer, said second layer comprised of hafnium and silicon and where the concentration of hafnium is greater than silicon;
   a third layer formed atop the second layer, said third layer comprised of hafnium and silicon and where the concentration of hafnium in the third layer is greater than the concentration of hafnium in the second layer; and
   wherein each said first layer, said second layer and said third layer comprise at least one common compositional element.

3. The dielectric film of claim 2 wherein the third layer further comprises nitrogen.

4. The dielectric film of claim 2 wherein the first layer is comprised of silicon rich metal silicate.

* * * * *